United States Patent [19]

Hinn

[11] 4,118,731
[45] Oct. 3, 1978

[54] VIDEO AMPLIFIER WITH SUPPRESSED RADIO FREQUENCY RADIATION

[75] Inventor: Werner Hinn, Zollikerberg, Switzerland

[73] Assignee: RCA Corporation, New York, N.Y.

[21] Appl. No.: 760,864

[22] Filed: Jan. 21, 1977

[30] Foreign Application Priority Data

Jul. 19, 1976 [GB] United Kingdom ............... 30005/76

[51] Int. Cl.$^2$ .................. H04N 9/18; H04N 5/68; H04N 5/14; H03K 5/00
[52] U.S. Cl. .................................... 358/65; 358/40; 358/184; 358/242; 330/265
[58] Field of Search ............. 358/184, 40, 21, 39, 358/64, 65, 242; 330/24, 262, 263, 265, 270, 271, 299

[56] References Cited

U.S. PATENT DOCUMENTS

| | | | |
|---|---|---|---|
| 2,892,165 | 6/1959 | Lindsay | 330/24 |
| 3,090,926 | 5/1963 | Engel | 330/24 |
| 3,105,198 | 9/1963 | Higginbotham | 330/24 |
| 3,519,946 | 7/1970 | Camezind | 330/24 |
| 4,035,840 | 7/1977 | Teuling | 358/184 |

Primary Examiner—John C. Martin
Attorney, Agent, or Firm—Eugene M. Whitacre; William H. Meagher; Ronald H. Kurdyla

[57] ABSTRACT

A wide bandwidth video amplifier suitable for driving a kinescope of a television receiver exhibits suppressed radio frequency (RF) harmonic radiation. The amplifier includes a transistor having a nonlinear conduction characteristic in a region of low current conduction. An input circuit including a source of video signals is coupled to a base electrode of the transistor, and output signals are provided from a collector output circuit of the transistor. Degenerative direct current feedback is provided from the output circuit to the input circuit. Undesired RF harmonics produced by dynamic operation of the transistor in a region of low current conduction is suppressed in a first instance by a nonlinear conduction device (e.g., a forward biased diode) arranged to provide degenerative emitter feedback for the transistor during low current conduction. Harmonic radiation is suppressed in a second instance by a low pass filter interposed between the input circuit and the base electrode of the transistor.

23 Claims, 11 Drawing Figures

VIDEO AMPLIFIER WITH SUPPRESSED RADIO FREQUENCY RADIATION

This invention relates to video amplifier circuits and, in particular, to wide bandwidth, low power consumption, video output stages with suppressed radio frequency harmonic radiation suitable for driving a color kinescope.

It is desirable for a video output stage to have a wide signal bandwidth, a linear signal response and low quiescent currents with attendant low power consumption. Conventional Class A video output amplifier stages for driving a capacitive load represented by a kinescope of a television receiver require relatively large output currents in order to achieve required signal bandwidth for large amplitude video signals. Reducing power consumption of Class A stages by reducing output currents tends to impair the large signal bandwidth response of the stage by reducing the slew rate (the change in output voltage per unit time) of the stage.

Low power, wide bandwidth transistor video output stages have recently been proposed. The low power stages typically exhibit lower power consumption than Class A stages, for example, and do not require transistors of large physical size, transistor heatsinks, or large power load resistors. Lower operating temperatures also result due to the low power consumption of these stages. Circuit cost is reduced, and reliability is enhanced.

A low power, wide bandwidth video output stage of this type commonly includes a pair of similar conductivity type transistors coupled across an operating voltage supply. Input signals are supplied to a first, common emitter amplifier transistor having an active load circuit. The active load circuit includes a second, high voltage transistor, and permits an increase in the load impedance of the first transistor to reduce bias currents while preserving the bandwidth response of the stage. A disconnect diode, interposed between an emitter of the load transistor and a collector of the first transistor, is biased to a non-conductive state under quiescent conditions. Degenerative direct current feedback is provided from an output to an input of the stage, and operating current for the stage is provided from the operating voltage source to a base of the load transistor and to the collector of the input transistor. Output signals appear at an emitter of the load transistor.

A video output stage of this type is described in an article entitled "Complementary Push-Pull Video Amplifiers for Television Receivers," by D. J. Beakhust and M. C. Gander, contained in Mullard Technical Communications Bulletin, Volume 13, No. 128, October 1975 and published by Mullard Limited, London; and also in a Consumer Design Note entitled "A Low Dissipation Class AB Video Output Stage Using TO-92 Transistors," published by Motorola Semiconductors Europe (1975). A low power video output stage employing complementary conductivity type transistors is also described in the aforementioned Technical Communications Bulletin published by Mullard Limited.

Various cascode video output amplifiers are also known (see, for example, U.S. Pat. No. 3,499,104 - Austin; U.S. Pat. No. 3,598,312 - Nillesen; and U.S. Pat. No. 3,823,264 - Haferl). The cascode arrangement typically includes a low voltage, high current gain, common emitter device coupled to a high voltage, unity current gain, common base device for isolating the collector of the low voltage device from load voltage variations, thereby minimizing Miller multiplication of collector-base capacitance of the low voltage device. The effect on amplifier bandwidth of the collector-base capacitances of the active devices is therefore less in the cascode arrangement than in, for example, a common emitter amplifier. A particularly advantageous low power consumption cascode video output stage is described in my co-pending U.S. Patent Application, Ser. No. 688,408, entitled "Video Amplifier," filed May 20, 1976, and assigned to the same assignee as the present invention, now abandoned in favor of my co-pending U.S. patent application Ser. No. 789,656 of the same title and assignee, filed Apr. 21, 1977. In the cascode amplifier described therein, in addition to the direct benefits of conserving power and avoiding thermal drift of operating characteristics, the reduced power consumption of the output devices enhances the wide bandwidth capability of the cascode amplifier.

Video output stages are required to process wide bandwidth video signals (e.g., zero Hertz to 4–5 MHz) of large amplitude (e.g., 110 volts peak-to-peak) in color television systems. The video output stages can produce non-linear signal distortions which, in the case of some relatively high power conventional Class A stages, result in undesired signal harmonic frequencies. Higher order signal harmonics developed and radiated by such video output stages can be detected by radio frequency (RF) signal processing circuits of the receiver and can interfere with received image representative video signals. The undesired radiated RF signals can appear as visible interference in an image displayed by the kinescope.

Attempts to suppress the RF interference have included placing RF chokes in the output circuits of the video output stages, and employing shielded cables for coupling video output signals to the kinescope. These solutions, however, undesirably increase circuit cost and complexity.

The recently proposed low power video output stages tend to produce greater RF radiation than conventional Class A stages. A cause of such RF radiation is the pronounced, non-linear (exponential) conduction characteristic of these stages due to low quiescent current operation. The nonlinear characteristic tends to produce signal distortions and, consequently, harmonics of the input signal frequency. Also, the input amplifier transistor can be operated at or near cut-off in response to rapid input signal amplitude transitions or transients, thereby producing significant high frequency signal harmonics due to the more pronounced nonlinear conduction characteristic in the region of transistor cut-off.

The undesired high frequency harmonics can extend into the very high frequency (VHF) band of television signals (e.g., 55 MHz to 211 MHz according to United States television system standards, and a comparable frequency range according to European television system standards). Suppression of the undesired RF harmonics by employing an output RF signal choke is difficult due to the low output impedance typically presented by the low-power video output stages.

In accordance with the present invention, a wide bandwidth video amplifier for driving an image reproducing device having an intensity control electrode exhibits suppressed RF harmonic radiation. The amplifier comprises a semiconductor amplifier having a nonlinear conduction characteristic in a region of low current conduction. Input and output circuits are associated with the amplifier, and means are included for coupling the output circuit to the intensity control electrode of the image reproducing device. Degenerative feedback is provided from the output circuit to the input circuit. In accordance with a feature of the invention, an impedance common to the input and output circuits comprises a semiconductor device having a nonlinear conduction characteristic in a region of low current conduction, for providing degenerative feedback for the amplifier when operating in the region of low-current conduction.

In accordance with a further feature of the invention, the input circuit includes a low pass signal filter network to assist suppression of the RF radiation independent of the operation of the common impedance.

In the drawings:

FIG. 1a–1d show signal waveforms useful in understanding the operation of the circuit shown in FIG. 1;

In the following description, circuit elements having the same reference designation are similar.

Figure 1:
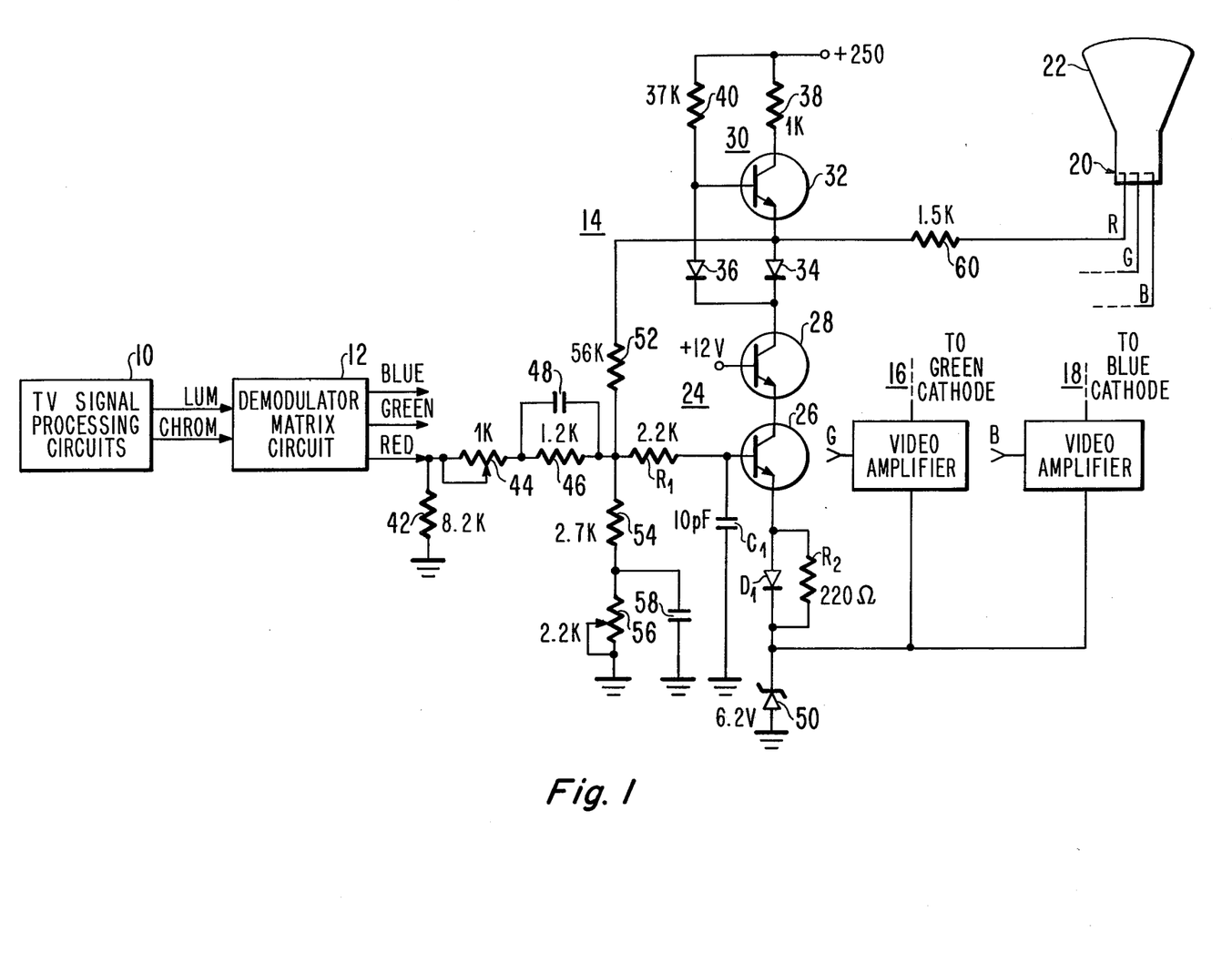
FIG. 1 shows, partially in block diagram form and partially in schematic circuit diagram form, a portion of a color television receiver employing a circuit constructed in accordance with the present invention.

Referring to the embodiment of the invention shown in FIG. 1, television signal processing circuits 10 including, for example, a video detector, provide luminance and chrominance signal components to a demodulator-matrix circuit 12 which, in turn, provides color video signals (e.g., red, green and blue image-representative signals) to respective video output amplifier circuits 14, 16, 18 (the latter two being shown in block form). Amplified video output signals are supplied from each of the amplifier circuits 14, 16, 18 to respective control (e.g., cathode) electrodes 20 of a color image reproducing cathode ray tube 22 of, for example, the in-line gun type. Since amplifiers 14, 16 and 18 are substantially identical, only amplifier 14 is shown and will be described in detail.

Amplifier 14 comprises a cascode arrangement 24 of a common emitter transistor 26 and a common base transistor 28. The emitter of transistor 26 is coupled to a point of reference voltage (e.g., +6.2 volts provided by a zener diode 50) via a diode $D_1$ and a resistor $R_2$ coupled in parallel.

The base of transistor 26 is supplied with video signals via a network including a shunt resistor 42, a white level adjustment variable resistor 44, a resistive voltage divider 46, 54, 56 (the latter serving as a black level adjustment) shunting capacitors 48, 58 and a resistor $R_1$ arranged as shown. A capacitor $C_1$ coupled to the base of transistor 26 forms a low pass, bandwidth limiting filter network with resistor $R_1$.

A relatively low direct bias voltage (e.g., +12 volts) is coupled to the base of common base transistor 28. An active load circuit 30 is coupled to the collector of transistor 28 and comprises a third transistor 32 arranged as an emitter follower, a "disconnect" diode 34 coupled between the emitter of follower 32 and the collector of transistor 28, a cross-over distortion compensation diode 36 coupled between the base of follower transistor 32 and the collector of transistor 28, a bias resistor 40 coupled between a relatively high voltage supply (e.g., +250 volts) and the base of follower transistor 32, and a current limiting resistor 38 coupled between the collector of transistor 32 and the voltage supply.

Degenerative voltage dependent direct current feedback is provided from the output of amplifier 14 (i.e., the emitter of follower transistor 32) to the base of transistor 26 via a resistor 52. Signals are coupled to the cathode 20 of the red electron gun (R) of cathode ray tube 22 via a series resistor 60. A capacitive load for stage 14 comprises stray circuit and transistor capacitances and the capacitive load presented by cathode ray tube 22.

In the following discussion of the operation of the illustrated video amplifier, it will be assumed that resistor 56 is adjusted so that a desired "black level" (quiescent) voltage of the order of 150 volts is provided at the emitter of load transistor 32. A quiescent current (e.g., 2.5 milliamperes) is then established in resistor 40, diode 36 and transistors 28 and 26. A quiescent emitter current (e.g., approximately 3 milliamperes) is also established in load transistor 32. The latter current flows in feedback resistor 52 and establishes base bias for transistor 26. In the quiescent state, diode 36 and the base-emitter junction of load transistor 32 are each forward-biased so that the cathode and anode of diode 34 are each at the same voltage. Diode 34 is therefore non-conducting in the absence of signals.

In operation, when a negative-going signal voltage transition is provided across resistor 42, resistors 44 and 46 convert such signal to a decrease in base current of transistor 26. The current through cascode transistors 26, 28, diode 36 and resistor 40 then decreases relatively rapidly from its quiescent value, and the collector voltage of transistor 28 and the base voltage of transistor 32 increase. When the collector voltage of transistor 28, and therefore the base voltage of transistor 32, rises by approximately 0.7 volts, load transistor 32 conducts heavily and the load capacitance of the cathode ray tube electrode 20 is charged via the low impedance voltage source represented by the emitter of transistor 32. The voltage dependent current feedback resistor 52 aids in linearizing the transfer characteristic of the stage by reducing crossover distortion (i.e., the delay in the start of the rise of the output voltage), as well as establishing a stabilized gain for the video output stage.

When a positive-going signal voltage transition is provided across resistor 42, cascode transistors 26, 28 are driven into conduction levels greater than the quiescent level, thereby causing the collector voltage of transistor 28 to drop. Diode 34 turns fully on when this voltage drop reaches about 0.7 volts and provides a low impedance discharge path from the load capacitance (cathode 20) through diode 34 and cascode amplifier 24 to reference potential.

The small signal behavior of the circuit provides relatively wide bandwidth. Since the common emitter transistor 26 need only sustain a relatively low reverse breakdown voltage and dissipates only a small amount of power as a result of its low collector voltage, a small signal device readily may be selected to provide the desired bandwidth.

Cascode stage 14, exclusive of filter network $R_1$, $C_1$ and the network including diode $D_1$ and resistor $R_2$, is described in greater detail in my co-pending U.S. Patent Application mentioned previously.

Under certain conditions, video amplifier stage 14 can produce unwanted high frequency harmonics of the video signal applied to stage 14. The harmonics can extend to within the frequency band of VHF signals received and processed by television signal processing circuits 10, causing interference with such received signals.

Signal distortion which can be produced by the nonlinear conduction characteristic of transistor 26 at or near cut-off current conduction contributes to the generation of higher order signal frequencies, or harmonics of the fundamental frequency of the video signal. The conduction nonlinearity of transistor 26 and attendant signal distortion become increasingly pronounced as the conduction of transistor 26 approaches cut-off. The operation of transistor 26 at a relatively low quiescent current level increases the likelihood of transistor 26 being caused to operate in a highly nonlinear region.

Transistor 26 can be caused to operate at or near cut-off in response to a rapid, negative-going input signal amplitude transition or transient. A large, corresponding positive-going signal amplitude transition then appears at the emitter output of transistor 32. If transistor 26 is then operating in the very nonlinear region at or near cut-off, excessive high frequency harmonics extending into the VHF band are produced. Amplified high frequency harmonics appear at the emitter output of transistor 32, and are radiated by a conductor connecting the output of video stage 14 to the electron gun input of kinescope 22. Thus, the generation of RF harmonics is facilitated by the operation of transistor 26 at low quiescent current levels, since transistor 26 can then be caused to operate at or near cut-off more readily than in the case of higher quiescent current levels.

Figures 1A, 1D:
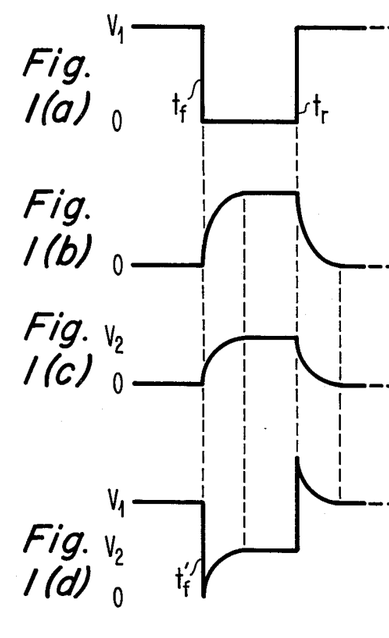

FIG. 1a depicts a portion of an input video signal waveform (e.g., 0.1 volt peak-to-peak amplitude or less) coupled to the end of resistor $R_1$ remote from the base of transistor 26. The input waveform has a rapid, short time duration, negative-going falling amplitude transition $t_f$ and a short duration, positive-going rising amplitude transition $t_r$. Transition $t_f$ is in a direction to reduce the conduction of transistor 26. In this instance, it is assumed that the fall time of transition $t_f$ is less than the charging time constant of the capacitive load, so that a positive-going signal as shown in FIG. 1b is produced at the emitter output of transistor 32 in response to the reduced conduction of transistor 26. A portion of the positive-going output signal (FIG. 1c) is coupled via resistor 52 and combined with the input waveform (FIG. 1a) at the junction of resistors 52 and $R_1$ to produce a combined input signal waveform (FIG. 1d).

The combined signal waveform (FIG. 1d) contains positive-going and negative-going overshoots developed in response to the lagging response times of the rising and falling amplitude transitions of the positive feedback signal (FIG. 1c). A negative-going amplitude transition $t'_f$ associated with the negative-going overshoot is in a direction to momentarily reduce the conduction of transistor 26 toward cut-off. When this occurs, the feedback loop is momentarily opened, and a significant amount of nonlinear distortion and attendant high frequency signal harmonics are produced.

The likelihood of transistor 26 being caused to operate in the highly nonlinear region of at or near cut-off is related to the amount by which the rise and fall times of the output signal exceed the associated fall and rise times of the input signal. Increasing the output load capacitance serves to increase the rise time of the output signal and therefore the magnitude of the negative-going overshoot of the combined input signal (FIG. 1d).

The feedback signal can inhibit operation of transistor 26 at or near cut-off in the presence of negative-going input video signals of relatively lower frequency, or signals having amplitude transitions of relatively longer duration. If the duration of such amplitude transitions is substantially equal to or greater than the charging time constant of the capacitive load, a positive-going output signal transition then appearing across the capacitive load in response to the decreasing conduction of transistor 26 exhibits a rising amplitude transition which is substantially in time coincidence with the negative-going (falling) amplitude transition of the input signal waveform. In this event, the combined input waveform will not contain amplitude overshoots, and the peak amplitude levels of the combined waveform will then correspond to positive levels $V_1$ and $V_2$ (see FIG. 1d). Transistor 26 will then be maintained in a conductive state due to the compensating effect of the closely tracking feedback signal, since the feedback signal is in a direction to increase the base current drive of transistor 26 in this instance.

The undesired RF harmonics can be suppressed by the bandwidth limiting low pass filter network including resistor $R_1$ and capacitor $C_1$. The network $R_1$, $C_1$ is included in the base input circuit of transistor 26 to limit the bandwidth response of signals coupled to the base of transistor 26 to the system signal frequency bandwidth of from zero hertz to between 4–5 MHz, for example. Resistor $R_1$ additionally serves to increase the driving source impedance of signals applied to the base of transistor 26. Nonlinear signal distortion is reduced since, as is known, the linearity of a transistor amplifier is improved when driven by a high impedance source. Resistor $R_1$ also serves to reduce the amplitude of the signal voltage appearing across the base-emitter junction of transistor 26.

Radio frequency harmonic radiation can be suppressed a greater amount by the operation of diode $D_1$ and resistor $R_2$.

Diode $D_1$ is a forward biased semiconductor PN junction device having a nonlinear current conduction characteristic in a region of low current conduction. Diode $D_1$ is coupled in series with and similarly poled for forward current conduction with the PN base-emitter junction of transistor 26, and is common to the input and output circuits of transistor 26. The nonlinear conduction characteristic of diode $D_1$ is similar to that of the base-emitter junction of transistor 26, so that diode $D_1$ provides nonlinear degenerative emitter (current) feedback for transistor 26 to counteract the nonlinearity which is otherwise exhibited by transistor 26, particularly at low transistor current in the vicinity of cut-off conduction.

The current of transistor 26 and consequently that of diode $D_1$ decrease rapidly in response to the negative-going amplitude transition of the combined input signal. During this time, the impedance of diode $D_1$ increases in proportion to the decreasing emitter current of transistor 26, thereby providing emitter degeneration or emitter curent feedback (emitter feedback provided by diode $D_1$ is negligible at normal, higher currents due to the small impedance of diode $D_1$ in such case). By this mechanism diode $D_1$ linearizes the conduction characteristic of transistor 26 in the vicinity of very low current conduction near cut-off. The more linear conduction characteristic results in reduced signal distortion and consequently RF harmonics of significantly reduced magnitude.

Thus diode $D_1$ permits transistor 26 to tolerate higher input signal overshoots ($t'_f$) in a direction to reduce the conduction of transistor 26 toward cut-off. The feedback loop including transistor 26 and resistor 52 remains closed and feedback remains effective. Nonlinear signal distortions and attendant RF signal harmonics are significantly reduced.

The adverse effects of large magnitude, negative-going overshoots of the combined input signal are further suppressed by filter network $R_1$, $C_1$. Resistor $R_1$ forms a voltage divider with the impedance presented by the base-emitter junction of transistor 26. Therefore, a combined input signal of reduced magnitude appears across the base-emitter junction of transistor 26. Also, harmonic frequencies above the system bandwidth of 4–5 MHz in this example are associated with the rapid, negative-going amplitude overshoot of the combined input signal (FIG. 1d). Such harmonic frequencies are attenuated by low pass filter network $R_1$, $C_1$ as well as by input capacitances of transistor 26. Therefore, the amplitude of the negative overshoot and the associated tendency to reduce the conduction of transistor 26 toward cut-off are further diminished. Network $D_1$, $R_2$ can be used either alone or in combination with network $R_1$, $C_1$.

Resistor $R_2$ limits the emitter impedance and thereby the amount of emitter feedback during the interval of decreasing transistors 26 conduction in response to negative-going input signal transitions, since excessive emitter feedback can impair the gain of transistor 26 and therefore upset the operation of the feedback network including transistor 26 and resistor 52. Resistor $R_2$ can be omitted if the quiescent current of the video output stage is sufficiently high such that the impedance of diode $D_1$ is not expected to exceed the value of resistor $R_2$ (220 ohms in this example).

Figure 2:
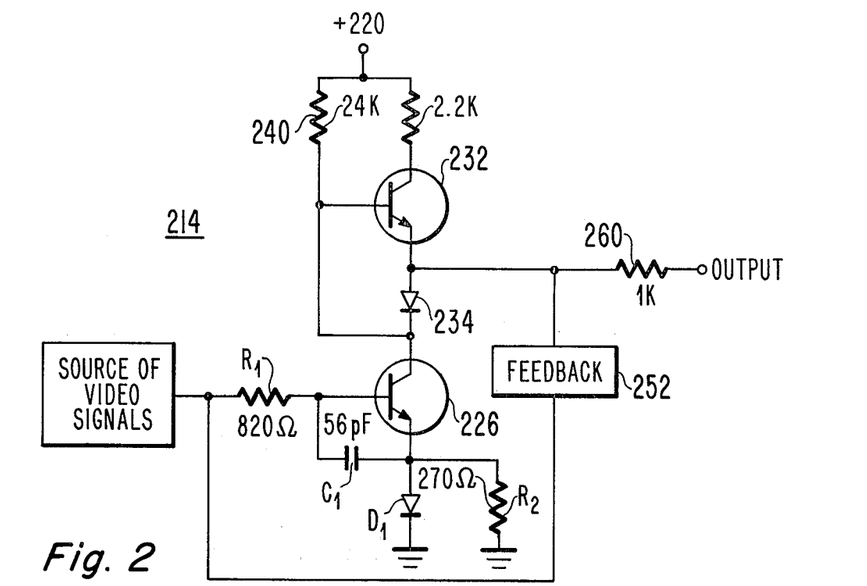
FIG. 2 shows another circuit embodiment of the present invention.

Referring now to FIG. 2, there is shown an alternate form of a low current, low power consumption common emitter video amplifier output stage 214 employing similar conductivity type transistors. Input signals are applied to a base electrode of an NPN common emitter transistor 226. An NPN emitter follower transistor 232 and a "disconnect" diode 234 comprise an active collector load for transistor 226. Output signals are developed across a load resistor 240 and are supplied from the emitter of transistor 232 via a resistor 260 to a capacitive load as noted in connection with FIG. 1.

The operation of stage 214 is similar to that of stage 14 of FIG. 1. Negative-going signal amplitude transitions are produced by conduction of transistor 226 through diode 234, and positive-going amplitude transitions are produced by conduction of emitter follower transistor 232. When the output signal appearing at the emitter of transistor 232 is negative-going, transistor 226 is conducting and discharges the load capacitance of stage 214 through diode 234. When the conduction of transistor 226 decreases in response to a negative-going input signal, its collector voltage increases, causing diode 234 to be cut-off. The load capacitance of stage 214 retains the voltage appearing at the emitter of transistor 232 until the base voltage of transistor 232 is sufficiently high to render transistor 232 conductive, at which time the load capacitance discharges. As with the arrangement of FIG. 1, the value of load resistor 240 can be greater than the load resistance of a Class A video output stage, thereby reducing the bias current and power consumption of the stage.

Bandpass limiting network $R_1$, $C_1$ of stage 214 serves the same purpose as the corresponding network of stage 14 of FIG. 1, except that in stage 214 capacitor $C_1$ is directly connected across the base-emitter junction of common emitter amplifier transistors 226. A diode $D_1$ and a resistor $R_2$ of stage 214 serves the same purpose as the corresponding elements of stage 14.

A degenerative feedback network 252 of stage 214 serves essentially the same purpose as the feedback network including resistor 52 of stage 14 of FIG. 1. Feedback network 252 can comprise a resistive voltage divider, for example, and can be coupled to the base input of transistor 226 as shown or can be coupled to an input of a preamplifier stage (not shown) prior to stage 214. Feedback network 252 can include video signal black and white level adjusting circuits, as well as frequency selective feedback to provide peaking at one or more selected video signal frequencies. The amount of AC and DC feedback can be varied to adjust the circuit gain and operating point, respectively.

Figure 3:
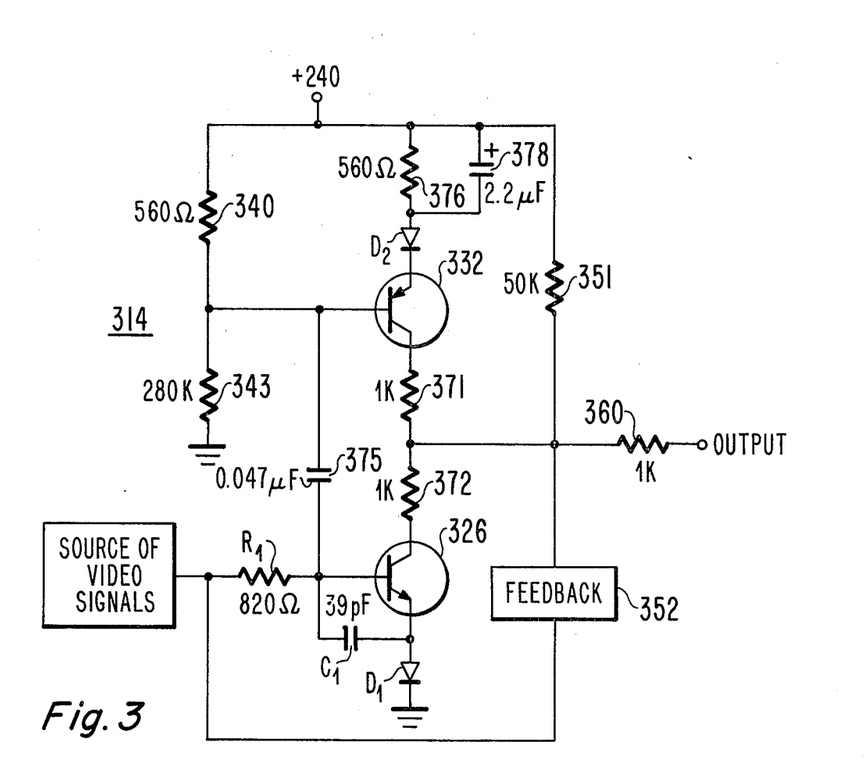
FIG. 3 shows a further circuit embodiment of the present invention.

FIG. 3 shows a low current, low power consumption video output stage 314 employing complementary conductivity type transistors 326 and 332. A video output stage of this type is described in detail in the aforementioned *Technical Communications Bulletin* published by Mullard Limited.

Briefly, bias for PNP transistor 332 is provided by resistors 340, 343 and 376 in conjunction with an operating supply voltage (+240 volts), and a bias resistor 351 coupled from the operating supply voltage to the junction of respective collector resistors 371 and 372 of transistors 332 and 326. Input video signals are applied to a base of NPN transistor 326 and AC coupled to a base of PNP transistor 332 via a capacitor 375, so that transistors 326 and 332 operate in antiphase or push-pull relation. Push-pull output signals from transistors 326 and 332 appear at the junction of resistors 371 and 372 and are coupled through a resistor 360 to an output terminal. A capacitor 378 serves to provide sufficient AC gain for transistor 332. Feedback network 352 is similar to feedback network 252 of stage 214 (FIG. 2).

Transistors 326 and 332 each exhibit a nonlinear conduction characteristic in a region of low current conduction at or near cut-off. A bandpass limiting low pass filter netwrok $R_1$, $C_1$ is similarly arranged and performs the same function as the corresponding network of FIG. 2. A diode $D_1$ arranged in the emitter circuit of transistor 326 serves to inhibit cut-off of transistor 326 in the presence of negative-going input signals which tend to cause transistor 326 to operate at or near cut-off, as discussed in connection with the circuit of FIG. 1. Likewise, an additioal diode $D_2$ serves to inhibit operation of PNP transistor 332 at or near cut-off in response to positive-going input signal transitions which tend to cause such operation.

Figure 4:
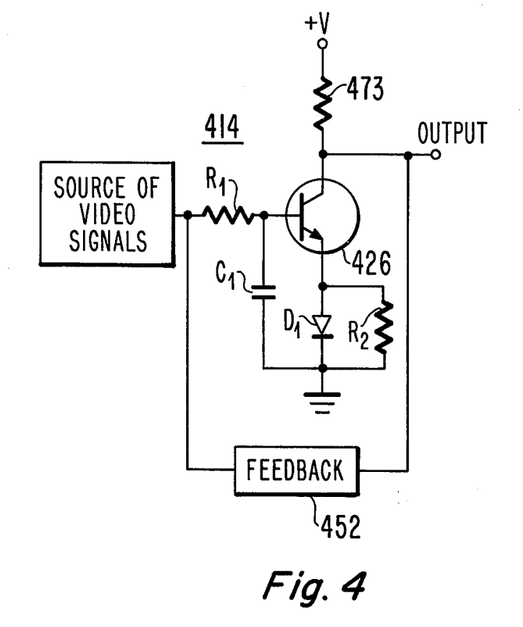
FIG. 4 shows still another circuit embodiment of the present invention.

FIG. 4 shows a Class A video output stage in accordance with the present invention. Input signals are coupled to a base of a transistor 426 and amplified output signals appear across a collector load resistor 473. A degenerative direct current feedback network 452 is coupled from the output to the input of the video output stage as mentioned in connection with FIGS. 1–3. Stage 414 also includes a low pass filter network $R_1$, $C_1$ and a degenerative feedback network $D_1$, $R_2$, all arranged as shown, to inhibit operation of transistor 426 at or near cut-off in the presence of rapid negative-going input signal transitions.

It is noted that a Class A video output stage is less susceptible to operation at or near cut-off in response to applied input signals, compared to low current, low power consumption stages of the types shown in FIGS. 1–3, since a Class A stage typically operates at a higher quiescent current level. The generation of RF harmonics can be suppressed by increasing the quiescent current level, although this undesirably increases power consumption and operating temperature. These and other problems in a Class A stage can be alleviated in accordance with an arrangement including networks $R_1$, $C_1$ and $D_1$, $R_2$ as shown in FIG. 4.

Figure 5:
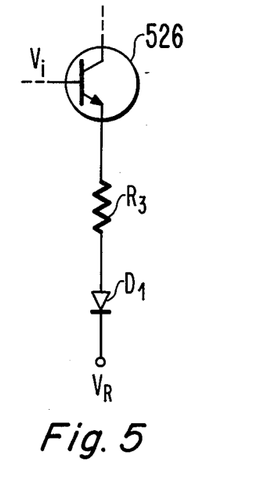
FIG. 5–7 show circuit modifications which can be incorporated in the circuits of FIGS. 1–4.
Figure 6:
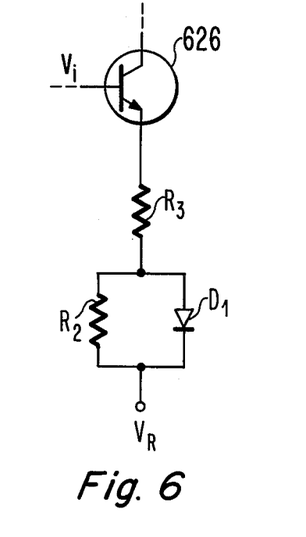
Figure 7:
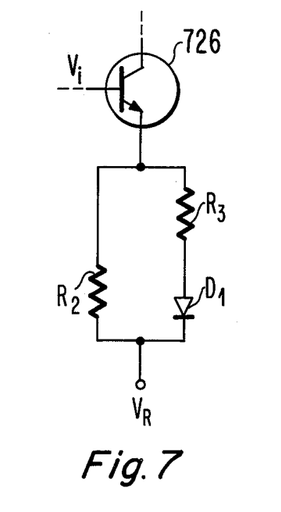

Each of FIGS. 5, 6 and 7 illustrates a modification to the emitter circuit of the input amplifier transistor (e.g., transistor 26 of FIG. 1) of a video output stage in accordance with the present invention. The emitter circuit of a common emitter transistor 526 of FIG. 5 includes a diode $D_1$ and an additional resistor $R_3$ coupled in series between an emitter of transistor 526 and a point of reference potential $V_R$. The role of diode $D_1$ has been discussed previously. In this example, resistor $R_2$ is omitted (i.e., the value of $R_2$ is infinite). Resistor $R_3$ serves as an emitter degeneration resistor to improve the gain stability of the video stage. Resistor $R_3$ may be required when, for example, input signals ($V_i$) are supplied to a base of transistor 526 from a preceding preamplifier stage having significant gain, and direct current degenerative feedback is provided from an output of the video output stage to an input of the preamplifier, thereby developing relatively high feedback loop gain.

Additional combinations of resistor $R_3$, resistor $R_2$ and diode $D_1$ in the emitter circuit of an input amplifier transistor of a video output stage are shown in FIGS. 6 and 7.

Various transistors exhibiting a small collector-base feedback capacitance (e.g., less than 2.5 picofarads) which have been found suitable for the load transistor (e.g., transistor 32 in FIG. 1) include the types BFR 88, BF 391 or RCA types 111C and BF 458. Suitable types for common base transistor 28 of FIG. 1 include RCA types 111C and BF 458. A suitable type for the small signal transistor (e.g., transistor 26 of FIG. 1) is the type BC 147. A suitable type for diodes $D_1$ and $D_2$ is the type BAX 13 or IN 914.

In video output stages of the type described, values of resistor $R_1$ can be chosen from between zero ohms and 3.3 kilohms, for example. Similarly, values for capacitor $C_1$ can be chosen from between zero (when the base capacitance of the input amplifier transistor alone is sufficient to provide effective filtering) and 56 pf, for example. Factors determinative of the values of resistance and capacitance ultimately chosen include the type of input amplifier transistor used, the quiescent current of the transistors, and stray circuit capacitances. These factors likewise apply to the selection of the values of resistorss $R_2$ and $R_3$. The value of resistor $R_2$ can be about 150 ohms or greater; the value of resistor $R_3$ can be from zero ohms to about 100 ohms, for example.

Although the invention has been disclosed in terms of particular circuit embodiments, it should be recognized that other arrangements can be devised by those skilled in the art without departing from the scope of the invention.

For example, transistors of opposite conductivity type from that shown can be employed, in which event the conduction polarity of diodes $D_1$ and $D_2$ should be reversed. Also, diodes $D_1$ and $D_2$ can comprise a transistor base-emitter junction, a diode-connected transistor, or similar device.

What is claimed is:

1. A video amplifier for driving an image reproducing device having an intensity control electrode, comprising:
   a semiconductor amplifier responsive to video signals including a range of signal amplitudes, said range including a first portion capable of causing said amplifier to operate within a region of low current conduction and a remaining portion capable of causing said amplifier to operate within a region of relatively higher current conduction, said amplifier having a nonlinear conduction characteristic in said region of low current conduction and having associated input and output circuits;
   means for coupling said output circuit to said intensity control electrode;
   a degenerative feedback network coupled from said output circuit to said input circuit;
   means for providing degenerative feedback for said amplifier; and wherein said feedback means comprises
      an impedance common to said input and output circuits, said impedance comprising a semiconductor device having a nonlinear conduction characteristic in a region of low current conduction for providing degenerative feedback for said amplifier, when operating in said region of low current conduction in response to said first video signal amplitude portion, in an amount sufficient to impede cut-off of said amplifier; and for providing degenerative feedback of a lesser amount for said amplifier when operating within said region of relatively higher current conduction in response to said remaining video signal amplitude portion.

2. A video amplifier according to claim 1, wherein said image reproducing device presents a capacitive load to said output circuit.

3. A video amplifier for driving an image reproducing device having an intensity control electrode exhibiting a capacitance, comprising:
   a semiconductor amplifier responsive to video signals including a range of signal amplitudes, said range including a first portion capable of causing said amplifier to operate within a region of low current conduction and a remaining portion capable of causing said amplifier to operate within a region of relatively higher current conduction, said amplifier having a nonlinear conduction characteristic in said region of low current conduction and having associated input and output circuits, said input circuit a low pass signal filter network;
   means for coupling said output circuit to said intensity control electrode, whereby said image reproducing device presents a capacitive load to said output circuit;
   a degenerative feedback network coupled from said output circuit to said input circuit;
   means for providing degenerative feedback for said amplifier; and wherein said feedback means comprises
      an impedance common to said input and output circuits, said impedance comprising a semiconductor device having a nonlinear conduction characteristic in a region of low current conduction for providing degenerative feedback for said amplifier, when operating in said region of low current conduction in response to said first video signal amplitude portion, in an amount sufficient to impede cut-off of said amplifier; and for providing degenerative feedback of a lesser amount for said amplifier when operating within said region of relatively higher current conduction in response to said remaining video signal amplitude portion.

4. A video amplifier according to claim 2, wherein:
said amplifier comprises a transistor having a base electrode coupled to said input circuit, a collector electrode coupled to said output circuit, and an emitter electrode coupled to a reference potential; and
said semiconductor device comprises a semiconductor PN junction device coupled to said emitter electrode and arranged in series with a base-emitter junction of said transistor, and being similarly poled for current conduction therewith.

5. A video amplifier for driving an image reproducing device having an intensity control electrode exhibiting a capacitance, comprising:
a transistor amplifier responsive to video signals including a range of signal amplitudes, said range including a first portion capable of causing said amplifier to operate within a region of low current conduction and a remaining portion capable of causing said amplifier to operate within a region of relatively higher current conduction, said amplifier having a nonlinear conduction characteristic in said region of low current conduction and having associated input and output circuits; said transistor having a base electrode coupled to said input circuit, a collector electrode coupled to said output circuit, and an emitter electrode coupled to a reference potential; said input circuit including a low pass filter network coupled to said base electrode;
means for coupling said output circuit to said intensity control electrode whereby said image reproducing device presents a capacitive load to said output circuit;
a degenerative feedback network coupled from said output circuit to said input circuit;
means for providing degenerative feedback for said transistor amplifier; and wherein said feedback means comprises
an impedance common to said input and output circuits, said impedance comprising a semiconductor PN junction device having a nonlinear conduction characteristic in a region of low current conduction coupled to said emitter electrode and arranged in series with the base-emitter junction of said transistor and being similarly poled for current conduction therewith, for providing degenerative feedback for said amplifier, when operating in said region of low current conduction in response to said first video signal amplitude portion, in an amount sufficient to impede cut-off of said amplifier; and for providing degenerative feedback of a lesser amount for said amplifier when operating within said region of relatively higher current conduction in response to said remaining video signal amplitude portion.

6. A video amplifier according to claim 5 for use with a source of video signals, wherein said low pass filter network comprises:
a resistance for coupling video signals from said source and feedback signals from said feedback network to said base electrode.

7. A video amplifier according to claim 6, wherein said low pass filter network further comprises:
a capacitance coupled between said base and emitter electrodes of said transistor.

8. A video amplifier according to claim 4, and further comprising:
a resistance coupled in parallel with said semiconductor PN junction device.

9. A video amplifier for driving an image reproducing device having an intensity control electrode exhibiting a capacitance, comprising:
a transistor amplifier responsive to video signals including a range of signal amplitudes, said range including a first portion capable of causing said amplifier to operate within a region of low current conduction and a remaining portion capable of causing said amplifier to operate within a region of relatively higher current conduction, said amplifier having a nonlinear conduction characteristic in said region of low current conduction and having associated input and output circuits; said transistor having a base electrode coupled to said input circuits, a collector electrode coupled to said output circuit, and an emitter electrode coupled to a reference potential; said input circuit including a low pass filter network coupled to said base electrode;
means for coupling said output circuit to said intensity control electrode whereby said image reproducing device presents a capacitive load to said output circuit;
a degenerative feedback network coupled from said output circuit to said input circuit;
means for providing degenerative feedback for said transistor amplifier; and wherein said feedback means comprises
an impedance common to said input and output circuits, said impedance comprising a semiconductor PN junction device having a nonlinear conduction characteristic in a region of low current conduction coupled to said emitter electrode and arranged in series with the base-emitter junction of said transistor and being similarly poled for current conduction therewith, for providing degenerative feedback for said amplifier, when operating in said region of low current conduction in response to said first video signal amplitude portion, in an amount sufficient to impede cut-off of said amplifier; and for providing degenerative feedback of a lesser amount for said amplifier when operating within said region of relatively higher current conduction in response to said remaining video signal amplitude portion; and
a resistance coupled in series with said PN junction device.

10. A video amplifier for driving an image reproducing device having an intensity control electrode, comprising:
a first active current conducting semiconductor device with a nonlinear conduction characteristic in a region of low current conduction;

input and output circuits associated with said first active device, said output circuit comprising a load impedance including a semiconductor PN junction device and a second active current conducting semiconductor device having a control terminal, said PN device being interposed between and arranged for series current conduction with main current conduction paths of said first and second active devices, a circuit point interconnecting said main current path of said second active device and said PN junction device forming a signal output terminal of said amplifier;

means for coupling said signal output terminal to said intensity control electrode;

a degenerative feedback network coupled from said signal output terminal to said input circuit;

direct current biasing means coupled to said control terminal and to said PN junction device; said biasing means being arranged such that said PN junction device is biased to a substantially non-conductive condition in a quiescent mode; and an impedance coupled in common to said input and output circuits, said impedance comprising a semiconductor device having a nonlinear conduction characteristic in a region of low current conduction, for providing degenerative feedback for said first active device when operating in said region of low current conduction.

11. A video amplifier according to claim 10, wherein: said image reproducing device presents a capacitive load to said signal output terminal.

12. A video amplifier according to claim 11, wherein: said input circuit comprises a low pass filter network.

13. A video amplifier according to claim 10, wherein: said biasing means is coupled to said control terminal through a bias resistance selected to provide a relatively low quiescent operating current for said video amplifier.

14. A video amplifier according to claim 11, wherein: said first active device comprises a first transistor with a base electrode coupled to said input circuit and collector and emitter electrodes defining a main current conduction path therebetween;

said second active device comprises a second transistor with a base electrode corresponding to said control terminal and collector and emitter electrodes defining a main current conduction path therebetween; and wherein said first and second transistors are of similar conductivity type.

15. An amplifier according to claim 14, wherein: said input circuit includes a low pass signal filter network coupled to said base electrode of said first transistor.

16. A video amplifier according to claim 15 for use with a source of video signals, wherein said low pass filter comprises:

a resistance for coupling video signals from said source and feedback signals from said feedback network to said base electrode of said first transistor.

17. A video amplifier according to claim 16, wherein said low pass filter network further comprises:

a capacitance coupled between said base and emitter electrodes of said first transistor.

18. A video amplifier according to claim 10, and further comprising:

a third active current conducting semiconductor device arranged in cascode amplifier configuration with said first active device.

19. A video amplifier according to claim 18, wherein: said first active device comprises a first transistor with a base electrode coupled to said input circuit and collector and emitter electrodes defining a main current conduction path therebetween;

said second active device comprises a second transistor with a base electrode corresponding to said control terminal and collector and emitter electrodes defining a main current conduction path therebetween;

said third active device comprises a third transistor with a base electrode and collector and emitter electrodes defining a main current conduction path therebetween; and wherein said first, second and third transistors are of similar conductivity type and have collector-emitter circuits coupled in series relation.

20. A video amplifier according to claim 19, wherein: said first transistor has a low breakdown voltage rating relative to said third transistor, said third transistor being arranged in common base configuration.

21. A video amplifier for driving an image reproducing device having an intensity control electrode, comprising:

a first active current conducting semiconductor device of a first conductivity type having a main current conduction path and a nonlinear conduction characteristic in a region of low current conduction, said first device being responsive to video signals including a range of signal amplitudes, said range including a first portion capable of causing said first device to operate within said region of low current conduction and a remaining portion capable of causing said first device to operate within a region of relatively higher current conduction;

a second active current conducting semiconductor device of a second, complementary conductivity type having a main current conduction path and a nonlinear conduction characteristic in a region of low current conduction, said main conduction paths of said first and second active device being arranged in series relation;

first and second input and output circuits respectively associated with said first and second active devices, said first and second output circuits having a common signal output terminal;

means for coupling said signal output terminal to said intensity control electrode;

a degenerative feedback network coupled from said output terminal to said first and second input circuits;

means for providing degenerative feedback for said first device; and wherein said feedback means comprises an impedance coupled in common with said first input circuit and said first output circuit, said impedance comprising a semiconductor device having a nonlinear conduction characteristic in a region of low current conduction for providing degenerative feedback for said first active device, when operating in said region of low current conduction in response to said first video signal amplitude portion, in an amount sufficient to impede cut-off conduction of said first device; and for providing degenerative feedback of a lesser amount for said first device when operating within a region of relatively higher current conduction in response to said remaining video signal amplitude portion.

22. A video amplifier according to claim 21, wherein:
said second device is responsive to video signals including a range of signal amplitudes, said range including a first portion capable of causing said second device to operate within said region of low current conduction and a remaining portion capable of causing said second device to operate within a region of relatively higher current conduction; and an additional impedance is coupled in common with said second input circuit and said second output circuit, said additional impedance comprising a semiconductor device having a nonlinear conduction characteristic in a region of low current conduction for providing degenerative feedback for said second active device, when operating in said region of low current conduction in response to said first video signal amplitude portion, in an amount sufficient to impede cut-off conduction of said second device; and for providing degenerative feedback of a lesser amount for said second device when operating within a region of relatively higher current conduction in response to said remaining video signal amplitude portion.

23. A video amplifier for driving an image reproducing device having an intensity control electrode, comprising:
first and second transistors of mutually complementary conductivity type each having respective main current conduction paths arranged in mutual series relation and a nonlinear conduction characteristic in a region of low current conduction, said transistors each with a base electrode and collector and emitter electrodes defining said current conduction paths;

first and second input and output circuits respectively associated with said first and second transistors, said first and second output circuits having a common signal output terminal, said base electrodes being coupled to said first and second input circuits, respectively;

a low pass filter network coupled between said first input circuit and said base electrode of said first transistor;

means for coupling said signal output terminal to said intensity control electrode;

a degenerative feedback network coupled from said output terminal to said first and second input circuits; and an impedance coupled in common with said first input circuit and said first output circuit, said impedance comprising a semiconductor device having a nonlinear conduction characteristic in a region of low current conduction, for providing degenerative feedback for said first transistor when operating in said region of low current conduction.

* * * * *